United States Patent [19] [11] 4,032,912
Wood [45] June 28, 1977

[54] INTENSITY MODULATED DISPLAY SYSTEM
[75] Inventor: David E. Wood, Schenectady, N.Y.
[73] Assignee: General Electric Company, Schenectady, N.Y.
[22] Filed: Oct. 3, 1974
[21] Appl. No.: 511,813
[52] U.S. Cl. .................... 340/324 A; 340/15.5 FC; 346/108; 346/110 R; 340/15.5 DS
[51] Int. Cl.² .......................................... G06F 3/14
[58] Field of Search ............... 340/324 A, 15.5 FC; 346/110, 108, 65, 109; 179/1 SA

[56] References Cited
UNITED STATES PATENTS

| | | |
|---|---|---|
| 1,784,522 | 12/1930 | Harrison ............................. 346/65 |
| 3,243,820 | 3/1966 | Alexander ......................... 346/109 |
| 3,603,963 | 9/1971 | Ward ............................. 340/324 A |
| 3,605,109 | 9/1971 | Tyler ................................. 346/110 |

Primary Examiner—Marshall M. Curtis
Attorney, Agent, or Firm—Geoffrey H. Krauss; Joseph T. Cohen; Jerome C. Squillaro

[57] ABSTRACT

A system for displaying three-dimensional data as a set of successive plots is described. Each individual plot is displayed on an oscilloscope and the successive plots are photographed. Amplitude information is quantized and represented in the plots, in combination, as the length and intensity of a segment, so that precise amplitude information is obtained as well as pattern enhancement.

7 Claims, 14 Drawing Figures

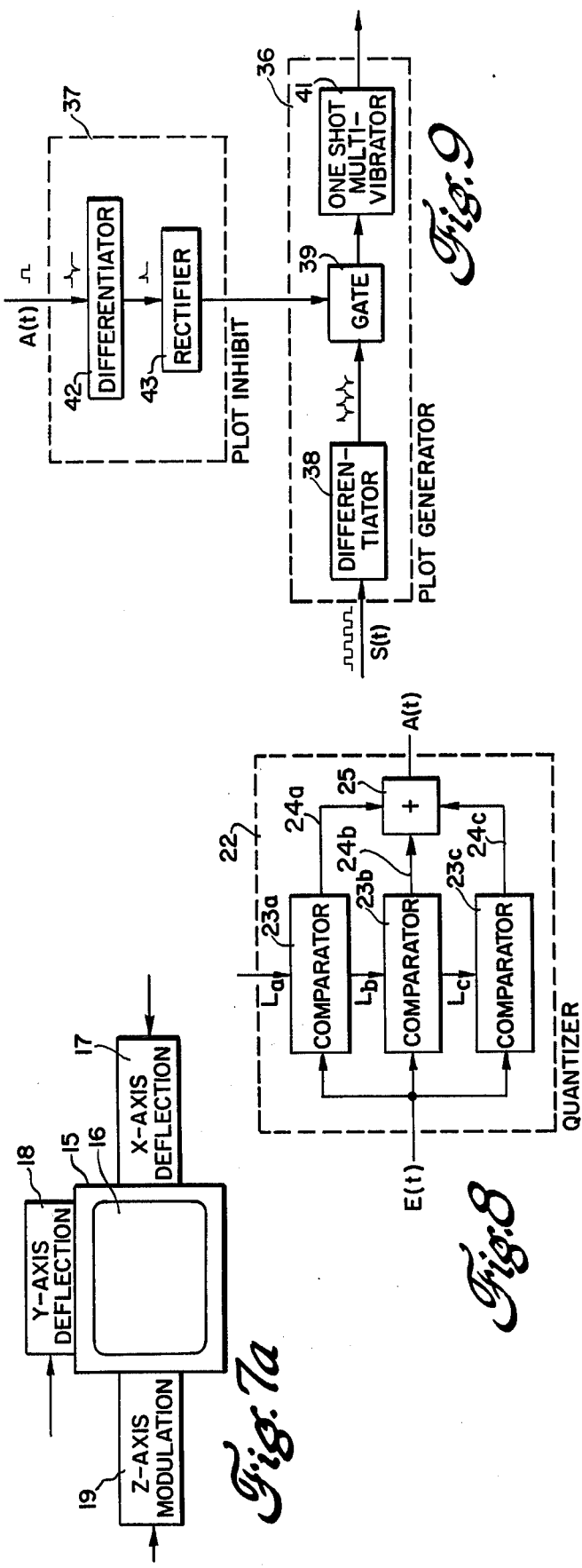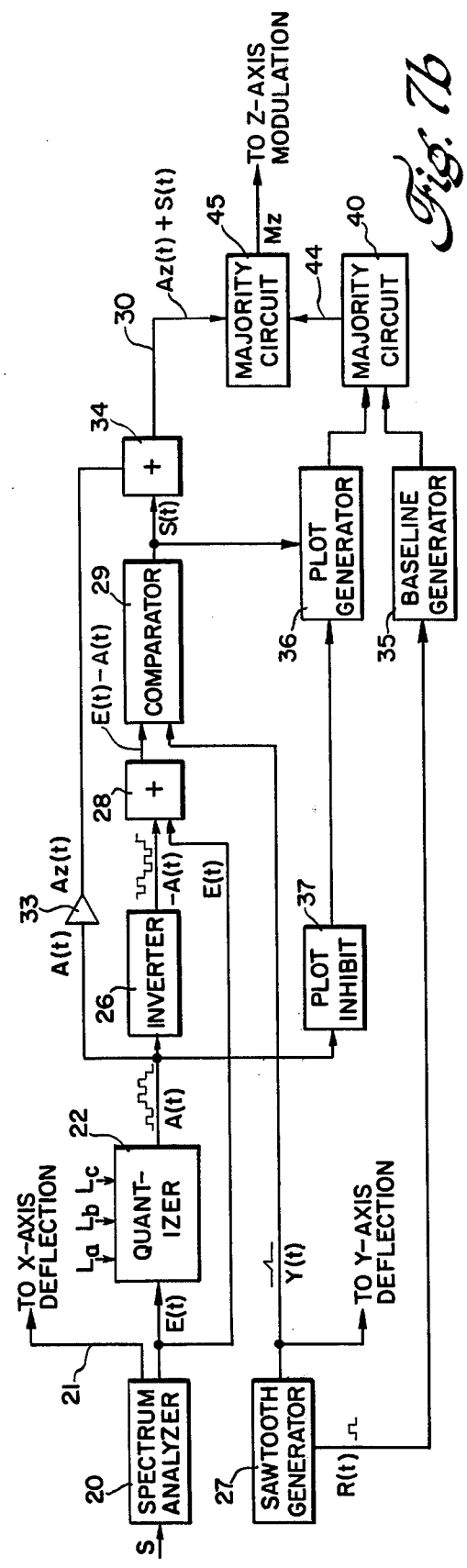

INTENSITY MODULATED DISPLAY SYSTEM

BACKGROUND OF THE INVENTION

1. Field of the Invention

This invention refers to the display of sets of two- or three-dimensional data and, more particularly, to a display system capable of providing precise magnitude information in all dimensions.

2. Description of the Prior Art

Display systems are used in various arts in the analysis of sets of two- or three-dimensional data both for visually detecting particular patterns and for obtaining magnitude information on the data.

In particular, display systems are used in the spectral analysis of complex waves as produced, for example, by a heartbeat or by a human voice, for the purpose of diagnosis or, respectively, recognition. When the complex wave is considered at a fixed instant of time, the analysis involves only two dimensions, namely, frequency and amplitude; while when the variations of wave with the time are also considered, the analysis involves three dimensions, namely, frequency, amplitude and time.

Various systems have been developed to display two- or three-dimensional data in order to give a synoptic image of the phenomenon to be analyzed. With particular reference to the spectral analysis, one prior art system consists of plotting a diagram in cartesian orthogonal coordinates with the time on the horizontal axis, the frequency on the vertical axis, and the relative amplitude of the spectrum components shown in terms of the darkness of the points of the diagram. Another prior art system consists of plotting a diagram in orthogonal coordinates with the time on the horizontal axis and the frequency on the vertical axis, the relative amplitude of each spectrum component being shown as a small deflection of the diagram in the direction of the horizontal axis. However, neither of such prior art systems provides precise magnitude information.

SUMMARY OF THE INVENTION

It is accordingly an object of this invention to provide a display system which, while giving a synoptic image of the phenomenon to be displayed, yields also precise magnitude information.

It is another object of this invention to provide a display system in which the display has a compact format.

It is another object of this invention to provide a display system in which magnitude information may be read without need for any particular instrument.

The foregoing objects are achieved in the present invention which provides means for displaying a signal as a two-dimensional surface and means for modulating stepwise the intensity of each cross section of the surface. In a preferred embodiment, a signal produced by a spectrum analyzer is displayed on a cathode ray tube as a two-dimensional surface in orthogonal coordinates with the frequency on the horizontal axis and the amplitude on the vertical axis, the amplitude of each spectrum component of a given frequency being represented in combination by the height and darkness of the surface corresponding to that frequency. The present invention will be more fully understood by considering the following detailed description of a preferred embodiment, with reference to the following drawings.

DESCRIPTION OF THE DRAWINGS

FIGS. 7a-7b represent a block diagram of an apparatus in accordance with the present invention;

FIGS. 8-9 represent particulars of the block diagram of FIG. 7;

DESCRIPTION OF THE PREFERRED EMBODIMENT

Figure 1:
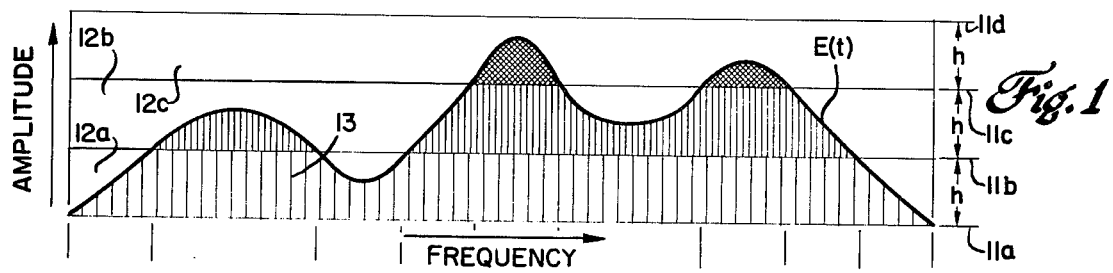
FIG. 1 represents a diagram in conventional orthogonal coordinates useful for explaining the present invention.

With reference to FIG. 1, there is illustrated a spectral diagram $E(t)$ in conventional cartesian orthogonal coordinates amplitude and frequency, shown in a particular instant of time $t$. The diagram $E(t)$ is divided into zones 12a-12c by four amplitude levels 11a-11d, with level 11a coinciding with the zero of the amplitude scale and $h$ being the increment of amplitude between one level and the next immediately greater level. In FIG. 1 the area 13 comprised between the diagram $E(t)$ and an immediately underlying one of levels 11 is differentially hatched according to the zone in which such area is comprised, to symbolize different tones in a gray scale.

Figure 2:
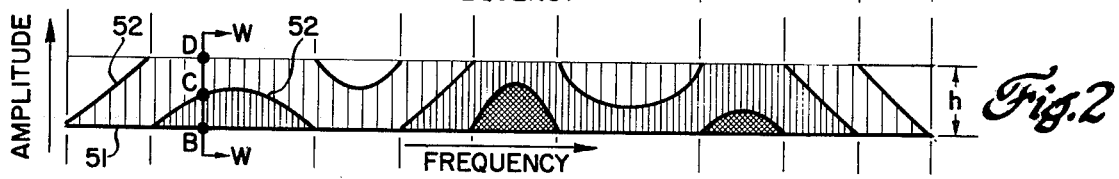
FIG. 2 represents a two-dimensional diagram as produced by a display in accordance with the present invention.

With reference to FIG. 2, the same spectral diagram of FIG. 1 is represented in a different, more compact, format. Each value of frequency is associated with a segment BD of length $h$ divided by a discontinuity point C into two segments BC and CD. Segment BC has a tone of gray corresponding to the tone of gray of the highest zone 12b reached at that frequency by the diagram of FIG. 1. The height of segment BC corresponds to the difference between the amplitude of $E(t)$ at that frequency and the amplitude of the bottom level 11b of the corresponding zone 12b. Segment CD has the next lower tone of gray with respect to segment BC.

The format described with reference to FIG. 2 dramatically shows the variations in amplitude of the diagram of FIG. 1. Moreover, the format of FIG. 2 has the advantage of being more compact (which advantage will be more fully understood with reference to the recording of diagrams varying with time, as discussed below), and it can be estimated without the need for any kind of mechanical aids such as a ruler. For example, let us assume that level 11a corresponds to zero db, level 11b to 16 db, level 11c to 32 db, and level 11d to 48 db. Accordingly, the tone of gray of zone 12a corresponds to zero db, the tone of gray of zone 12b corresponds to 16 db and the tone of gray of zone 12c corresponds to 32 db. With these assumptions, the amplitude corresponding to the segment BC of FIG. 2 is immediately estimated as about one-half of 16 db (because segment BC is about one-half as long as $h$) plus the amplitude corresponding to the tone of gray of segment CD, i.e., 16 db; thus the estimated amplitude is about $8 + 16 = 24$ db.

The apparatus for providing a display of the type as shown in FIG. 2 in accordance with a preferred embodiment of this invention will be described with reference to FIGS. 7a and 7b. The apparatus uses a display means, such as an oscilloscope 15 (FIG. 7a) in which an electron beam describes a diagram on a phosphor screen 16. The oscilloscope 15 is provided with X-axis and Y-axis deflecting means 17 and 18, respectively, as well as Z-axis modulating means 19. Such oscilloscopes are well known in the art.

An electrical signal S to be analyzed (FIG. 7b), which may be obtained for example by transducing with a microphone a heartbeat or a human voice, is connected with a spectrum analyzer 20. Spectrum analyzers are well known in the art and generally comprise a mechanism for scanning a band of frequencies and producing an output signal corresponding to the amplitude detected at the various frequencies within the band. A signal 21 produced by analyzer 20 in synchronism with the frequency scanning, is connected with the X-axis deflecting means 17 to cause the electron beam of oscilloscope 15 to horizontally scan the screen 16. Spectrum analyzer 20 also produces a signal $E(t)$ corresponding, on a logarithmic scale, to the amplitude of signal S detected at the various scanned frequencies. Such signal $E(t)$ is connected with a quantizer 22, to which is also connected three electric signals $La$, $Lb$, $Lc$ having constant magnitudes $h$, $2h$ and $3h$, respectively.

Figure 3:
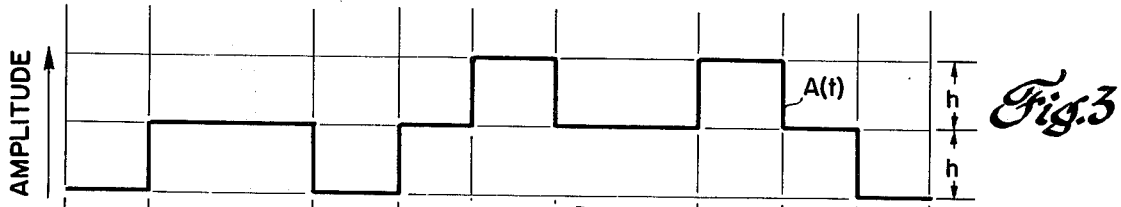
FIGS. 3-6b represent diagrams useful for explaining the present invention.

The quantizer 22 comprises three comparator circuits $23a$, $23b$, $23c$ (FIG. 8), connected in parallel with signal $E(t)$ and, respectively, with signals $La$, $Lb$, $Lc$. The output signal $24_i$ where i = a, b or c of each comparator $23_i$ is equal to zero when the amplitude of $E(t)$ is less than the amplitude of $Li$ and is equal to $Li$ when the amplitude of $E(t)$ is equal to, or greater than, the amplitude of $Li$. The signals $24_i$ are combined in a summing circuit 25 providing a quantized signal $A(t)$. The shape of signal $A(t)$, as a function of signal $E(t)$, is shown in FIG. 3 with reference to FIG. 1. In this description, only three signals $Li$ are considered for convenience, but, of course, the number of signals $Li$ of quantizer 22, and correspondingly the number of steps of signal $A(t)$, may be greater than three.

Signal $A(t)$ (FIG. 7b) is connected with an inverter 26 providing an output signal $-A(t)$. Signals $-A(t)$ and $E(t)$ are combined in a summing circuit 28 providing an output $E(t)-A(t)$.

A sawtooth generator 27 provides a sawtooth signal $Y(t)$ and a blanking pulse signal $R(t)$. Signal $Y(t)$ is connected with the Y-axis deflecting means 18 to cause the electron beam of oscilloscope 15 to scan the screen 16 by subsequent vertical scans. Signals $Y(t)$ and $E(t)-A(t)$ are connected with a comparator circuit 29 which provides an output signal $S(t)$ being:

$$S(t) = 0 \text{ when } Y(t) \quad E(t)-A(t)$$

$$S(t) = b \text{ when } Y(t) < E(t)-A(t)$$

Figure 4:
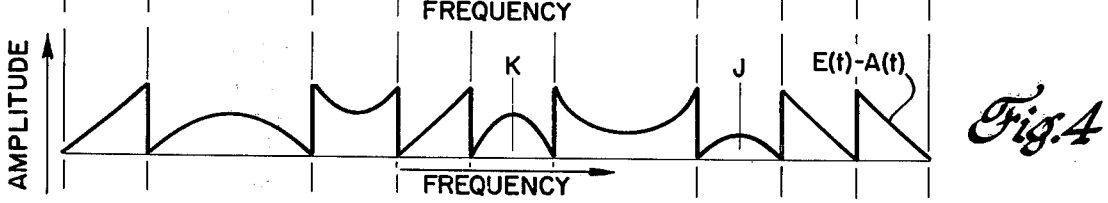
Figure 5A:
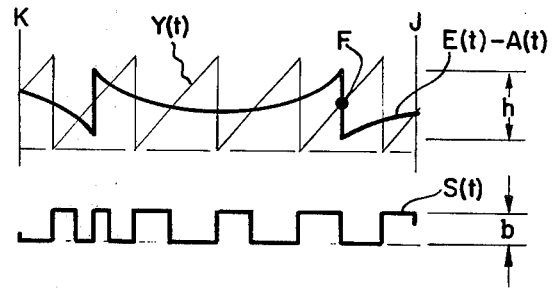
Figure 5B:
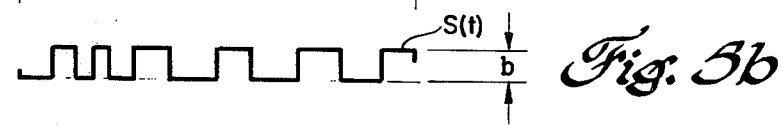

FIG. 4 shows the waveform of $E(t)-A(t)$ for a waveform of $E(t)$ as shown in FIG. 1. A section $k-j$ of the waveform of $E(t)-A(t)$, with an enlarged frequency scale, is shown in FIG 5a superimposed on the waveform of $Y(t)$. FIG. 5b shows the corresponding waveform of $S(t)$. With reference to FIGS. 5A and 5B, it will be noted that the signal $S(t)$ decreases in value, from $b$ to zero corresponding to a point of variation in the tone of gray, such as at point C (FIG. 2).

The signal $A(t)$ is connected with an amplifier 33 (FIG. 7b) which provides an output signal $Az(t)$. The amplification of amplifier 33 is $b/h$, so that the signal $Az(t)$ has the same shape as that of $A(t)$ but with steps $b$ high rather than $h$. The signal $Az(t)$ and $S(t)$ are combined in a summing circuit 34 which produces a signal 30 equal to $Az(t) + S(t)$.

The blanking signal $R(t)$ from sawtooth generator 27 is connected with a baseline generator 35. Baseline generator 35 comprises a one-shot multivibrator which produces a pulse of a short duration with respect to the period of the sawtooth signal $Y(t)$. The parameters of such one-shot multivibrator are so selected that the produced pulses are in synchronism with the passage of the electron beam of cathode ray tube 15 by the origin of the amplitude axis on screen 16.

The signal $S(t)$ is connected with a plot generator 36. The signal $A(t)$ is connected with a plot inhibit circuit 37 which is in turn connected with plot generator 36. With reference to FIG. 9, the circuit for the plot generation and inhibition is described in more detail. Signal $S(t)$ is connected with a differentiator 38 which is in turn connected, through a gate 39, with a one-shot multivibrator 41 responding to negative pulses. Signal $A(t)$ is connected with a differentiator 42 which is in turn connected with a rectifier 43. Rectifier 43 controls the one-shot multivibrator 41 through gate 39.

The baseline generator 35 and the plot generator 36 are connected with a majority circuit 40 producing a signal 44. The majority circuit 40 and the summing circuit 34 are connected with the Z-axis modulating means 19 of oscilloscope 15 through a majority circuit 45. The signal Mz connected by circuit 45 with the Z-axis modulating means 19 is the signal with the highest magnitude between signals 30 and 44. Signal 44 is, in turn, the signal with the highest magnitude between the signals produced by circuits 35 and 36. The modulation of Z-axis is such that signal Mz applied to modulation means 19 increases the intensity of the electron beam of oscilloscope 15, so that if the amplitude of Mz increases, the image on screen 16 will be negative with respect to the image shown in FIG. 2.

Figure 6A:
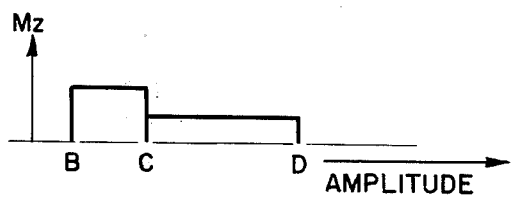
Figure 6B:
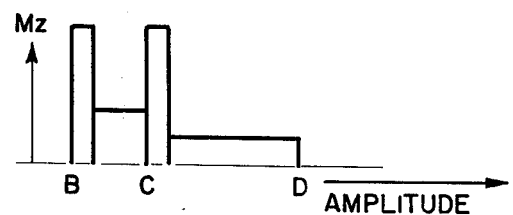

The operation of the apparatus will be better understood with reference to FIGS. 2, 6a, and 6b. FIG. 6a shows a diagram of the signal Mz applied to the Z-axis modulating means 19, corresponding to the scan of section W—W of FIG. 2. For convenience, the operation of baseline generator 35 and plot generator 36 is omitted in FIG. 6a. The magnitude of signal Mz between points B and C is equal to the corresponding magnitude of the sum of $Az(t)$ and $S(t)$, i.e., $b + b = 2b$. Between points C and D, $S(t)$ is zero; accordingly, the corresponding magnitude of Mz is $b + 0 = b$. Correspondingly, the electron beam of oscilloscope 15 describes on screen 16 a segment which has on its lower portion corresponding to BC a tone of gray proportional to $2b$, and on its higher portion corresponding to CD a tone of gray proportional to $b$. Since the vertical scans on the oscilloscope are very close together, the observer will see on screen 16 uniform areas of different tones of gray, rather than the different hatchings as shown for convenience in FIG. 2. It will be noted that signal Az represents the gray tone of the area above the discontinuity point C, while the signal $S(t)$ represents the variation of gray tone between below and above the discontinuity point C.

FIG. 6b shows the diagram of Mz corresponding to the scan of section W-W of FIG. 2, taking into account also the operation of baseline generator 35 and plot generator 36. Baseline generator 35 applies to the Z-axis modulation means 19 a short pulse corresponding to point B, describing in the subsequent scans a baseline 51. Another short pulse is produced by one-shot multivibrator 41 of plot generator 36 corresponding to point C, when the signal S(t) decreases from b to zero, describing in the subsequent scans a plot 52. The plot inhibit circuit 37 has the purpose of avoiding a plot signal generated by plot generator 36 when the signal A(t) increases a step, as shown at point F (FIG. 5a). Otherwise, a plot signal would be produced, because the signal S(t) correspondingly decreases from b to zero, and on screen 16 of cathode ray tube 15 there would be described a point which actually does not belong to the plot. Accordingly, the plot inhibit circuit 37 inhibits a plot pulse from being produced when A(t) increases.

Figure 10:
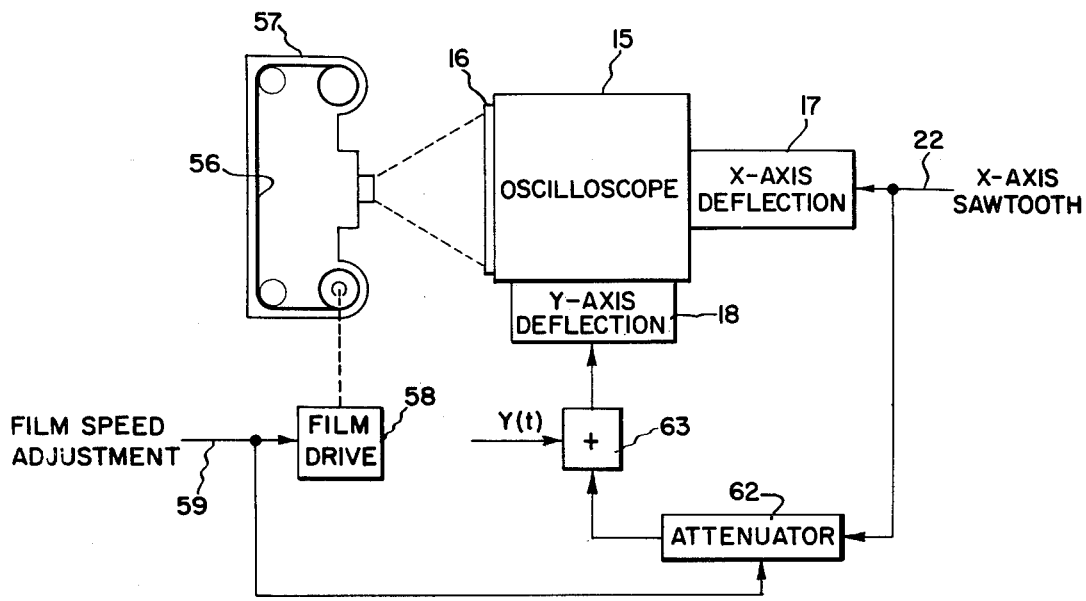
FIG. 10 represents an arrangement for recording three-dimensional diagrams in accordance with the present invention.
Figure 11:
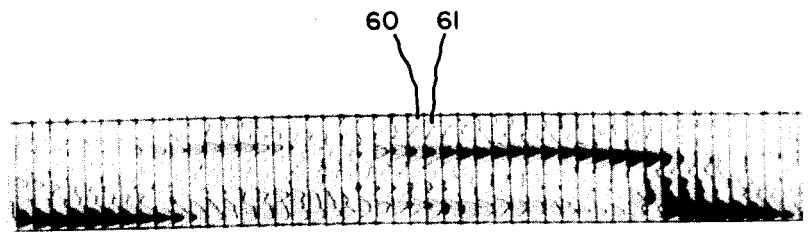
FIG. 11 represents a three-dimensional diagram as produced by an arrangement in accordance with FIG. 10.

FIG. 10 shows an arrangement for providing a record of the variation of the spectral diagram E(t) with time. The display on screen 16 of oscilloscope 15 is recorded on a continuous motion photographic film 56 by means of a camera 57. In this arrangement, screen 16 must have a very low persistence. Film 56 is driven by conventional film driving means 58 provided with a speed adjustment 59. FIG. 11 shows a sample of such a record on a negative film, obtained with the arrangement of FIG. 10. The spacing d between individual diagrams 60, 61 (FIG. 11) relative to successive times is provided by the film motion. Spacing d can be adjusted by means of film speed adjustment 59 to prevent skewing of the image on film 56 due to film motion; a reduced version of X-axis sawtooth 22 is applied to the Y-axis deflecting means 18 for adjusting each vertical scan by the electron beam by oscilloscope 15 of an amount proportional to the order number of each of the vertical scans made during a single horizontal scan, to compensate for the film movement during a single horizontal scan. To this end, signal 22 is connected through an attenuator 62 (FIG. 10) to a summing circuit 63 which is also connected with the Y-axis sawtooth signal Y(t); summing circuit 62 is connected to the Y-axis deflecting means 18. The attenuation of attenuator 62 is set according to the film speed adjustment 59. It is apparent from FIG. 11 the advantage of having compact individual time sequential diagrams 60, 61 for displaying patterns as regions of uniform darkness is that a region of repetitively large magnitude appears as a dark stripe running generally along the longitudinal axis of the film (which axis is horizontal in FIG. 11, where the film is obviously on its "side"). Patterns can be particularly enhanced by adjusting the speed of film 56 in order to have lower spacing d between successive diagrams. For low spacing values of d, due to the limited resolution power of the eye, each segment of a scan like BD in FIG. 2 will be perceived as having a uniform tone of gray, given by the average of the respective tones of BC and CD. For such low values of spacing, it will be convenient to disconnect the baseline and plot generators 35 and 36, respectively, (FIG. 7b), from the Z-axis modulation means 18 by means of a suitable switch (not shown), for avoiding baseline and plot pulses that alter the average tone of gray perceived by the eye.

It will be apparent to those of ordinary skill in the art that various modifications can be made to the preferred embodiment herein described without departing from the spirit and scope of the present invention.

I claim:

1. A system for displaying a continuously variable analog input signal having variations of three independent parameters, comprising:
    a. input means for receiving said input signal to be displayed;
    b. display means coupled to said input means for displaying said input signal as a final signal upon a two-dimensional surface having a pair of mutually orthogonal parameter axes, a first one of said axes corresponding to an entire range of allowable values of a first one of said parameters and the remaining one of said axes having a range corresponding to a submultiple of the total allowable value range of another parameter;
    c. first means responsive to said input signal for providing a quantized signal having one of a multiplicity of discrete levels including a zero level, said quantized signal being provided at said zero level when said input signal has an amplitude between zero and a lowest one of said multiples of the total range of said another parameter, said quantized signal having sequentially greater discrete amplitudes of said multiplicity of levels of said another parameter for said input signal exceeding sequentially greater multiples of said total range submultiple;
    d. second means for providing a difference signal proportional to the difference between said input signal and said quantized signal;
    e. local signal generating means for providing a periodically varying comparative signal, each period of said comparative signal being associated with substantially a single value of said first parameter and
    f. comparator means for generating an additional signal whenever said difference signal exceeds said comparative signal;
    g. third means for applying said additional signal to said display means to vary the intensity thereof to cause those areas of the displayed final signal that correspond to portions of said another parameter of said input signal exceeding successively greater ones of the multiplicity of levels of said quantized signal to have successively greater intensities for each value of said first parameter; and
    h. fourth means for applying another signal to said display means to cause the boundary between successive portions of said display having different intensities to be formed as a curve in accordance with the amplitude of said another parameter of said input signal relative to said quantized signal level to indicate the incremental value of said another parameter of said input signal relative to the general level thereof;
    i. one of a succession of said two-dimensional surfaces being generated in a sequential manner for each sequential value of a remaining one of said three parameters to display the variation thereof in accordance with the variation in the first and another parameters.
2. A display system in accordance with claim 1, further comprising:
    a. baseline pulse generating means connected with said local signal generating means, for providing a first pulse signal at a predetermined point of each of said scans, and
    b. means for applying said first pulse signal to said modulating means.

3. A display system in accordance with claim 2, wherein said fourth means comprises:
   a. plot pulse generating means connected with said comparator means, for providing a second pulse signal as a function of the comparison by said comparator means, and
   b. means for applying said second pulse signal to said modulating means.

4. A display system in accordance with claim 1, wherein said fourth means comprises:
   a. second pulse generating means connected with said comparator means, for providing a plot pulse signal as a function of the comparison by said comparator means, and
   b. means for applying said second pulse signal to said modulating means.

5. A display system in accordance with claim 4, further comprising means, responsive to the sense of variation of said quantized signal, for inhibiting said plot pulse generating means.

6. A display system in accordance with claim 5, further comprising means for connecting said modulating means with the signal having the highest magnitude among said output signals and said baseline and plot pulse signals.

7. A display system in accordance with claim 1, further comprising:
   a. recording means continuously moving past said surface in a particular direction, and
   b. means for periodically adjusting said display for compensating the movement of said recording means.

* * * * *

UNITED STATES PATENT AND TRADEMARK OFFICE
CERTIFICATE OF CORRECTION

PATENT NO. : 4,032,912
DATED : June 28, 1977
INVENTOR(S) : David E. Wood

It is certified that error appears in the above-identified patent and that said Letters Patent are hereby corrected as shown below:

Column 7, line 11, "second" should read -- plot --;

line 12, "plot" should read -- second --.

Signed and Sealed this

Twenty-third Day of May 1978

[SEAL]

Attest:

RUTH C. MASON
Attesting Officer

LUTRELLE F. PARKER
Acting Commissioner of Patents and Trademarks